United States Patent [19]
Chien et al.

[11] Patent Number: 5,504,038
[45] Date of Patent: Apr. 2, 1996

[54] METHOD FOR SELECTIVE TUNGSTEN SIDEWALL AND BOTTOM CONTACT FORMATION

[75] Inventors: Sun-Chieh Chien, Hsin-Chu; Jengping Lin, Tayuan Village, both of Taiwan

[73] Assignee: United Microelectronics Corporation, Hsinchu, Taiwan

[21] Appl. No.: 450,409

[22] Filed: May 25, 1995

[51] Int. Cl.$^6$ .................................................. H01L 21/44
[52] U.S. Cl. ........................... 437/192; 437/195; 437/200
[58] Field of Search ...................................... 437/192, 195, 437/200, 190

[56] References Cited

U.S. PATENT DOCUMENTS

| | | |
|---|---|---|
| 4,589,196 | 5/1986 | Anderson . |
| 4,630,357 | 12/1986 | Rogers et al. . |
| 4,898,841 | 2/1990 | Ho .................................. 437/200 |
| 4,962,414 | 10/1990 | Liou et al. . |
| 4,963,511 | 10/1990 | Smith ............................. 437/192 |
| 5,066,612 | 11/1991 | Ohba et al. ..................... 437/192 |
| 5,084,413 | 1/1992 | Fujita et al. .................... 437/189 |
| 5,128,278 | 7/1992 | Harada et al. .................. 437/192 |
| 5,162,262 | 11/1992 | Ajika et al. .................... 437/200 |
| 5,187,120 | 2/1993 | Wang ............................. 437/192 |
| 5,219,789 | 6/1993 | Adan ............................. 437/192 |
| 5,286,675 | 2/1994 | Chen et al. .................... 437/195 |
| 5,371,041 | 12/1994 | Liou et al. .................... 437/192 |
| 5,427,981 | 6/1995 | Choi ............................. 437/195 |

*Primary Examiner*—George Fourson
*Assistant Examiner*—C. Everhart
*Attorney, Agent, or Firm*—George O. Saile; William Stoffel

[57] ABSTRACT

A structure and method is provided for forming a contact plug in a contact hole in a dielectric layer on a semiconductor substrate. A polysilicon spacer is formed on the sidewalls and bottom of the contact hole. A metal, such as titanium, is deposited on the sidewalls and bottom of the hole and on the dielectric layer. The substrate is heated to form a metal silicide layer, such as TiSi$_x$, and a metal nitride layer, such as TiN, on the side-walls and bottom of the contact hole. Any remaining metal layer and metal nitride layer formed in the heating process is removed. This leaves the titanium silicide layer on the contact hole walls. Tungsten is deposited to fill the contact hole where the metal silicide promotes the nucleation of the tungsten. In a preferred embodiment, to further promote nucleation of the tungsten, a second metal nitride layer is formed on the surface; of the metal silicide layer just prior to tungsten deposition.

18 Claims, 5 Drawing Sheets

METHOD FOR SELECTIVE TUNGSTEN SIDEWALL AND BOTTOM CONTACT FORMATION

BACKGROUND OF INVENTION

1) Field of the Invention

This invention relates to integrated circuits and semiconductor devices. It relates to methods of filling contact holes and contact structures made by those methods and more specifically, this invention relates to a method and a structure for forming sidewall and bottom silicide in a contact hole.

2) Description of the Prior Art

In the fabrication of semiconductor devices, electrical contacts are typically made by opening contact holes in a dielectric isolation layer to expose regions of the semiconductor device to which electrical contact must be made, and depositing a layer of metal over each contact hole. The layer of metal extends from the bottom of the hole, up the sidewalls of the hole and over the dielectric isolation layer to another contact hole or to a contact pad overlying the dielectric isolation layer.

In a conventional process, the layer of metal, typically Al—Si is deposited by DC magnetron evaporation or electron beam evaporation. Such physical deposition techniques provide good coverage for horizontal surfaces, but do not always cover vertical surfaces which can cause problems in deep contact holes.

Where an electrical via for interconnection purposes has a high aspect ratio, or ratio of depth to diameter of the via, traditional metal sputtering, such as TiW/Al/TiW, has become a limiting process in submicron designs because of poor metal step coverage, poor electro-migration resistance, and higher than acceptable electrical contact resistance.

Selective chemical vapor deposition (CVD) of tungsten in the vias and on electrical contact regions has been used to overcome some of these problems. In the conventional selective CVD process, a refractory metal, such as tungsten is deposited only on exposed silicon at the bottoms of the contact holes. The selective CVD may be continued until the tungsten fills the contact holes. Because the tungsten is selectively deposited in the contact holes, etching of unwanted tungsten is required when one or more of the contact holes is overfilled. Overfilling of a contact hole results in an excess metal formation above the surface which is sometimes called a "nail's head" because of its shape. Overfilling is common in devices where the contact holes have different depths. In addition, the selective chemical vapor deposition (CVD) of tungsten has other problems that must be overcome. First, trapping of a polycrystalline insulator, such as a titanium trifluoride, $TiF_3$, at the tungsten/titanium silicide ($W/TiS_x$) interface adjacent to a via or an electrical contact will induce high contact resistance. Second, selectivity loss of an oxide surface in tungsten deposition may induce severe defects and reduce circuit yield. During CVD of tungsten (W), an exposed adjacent oxide surface may become contaminated by a photoresist patterning process so the, contaminated oxide behaves as a tungsten nucleation layer that will include severe defects. Third, the tungsten plug must be formed to completely fill contact hole having a narrow diameter and large depth.

U.S. Pat. No. 4,898,841 to Ho teaches a method of filling contact holes whereby a tungsten silicide layer is formed on the side-walls of a contact hole.

U.S. Pat. No. 5,286,675 to Chen et. al, teaches a method of forming a contact using a blanket tungsten etch back step and a disposable (etch back the SOG layer which underlies the blanket W layer) SOG layer.

U.S. Pat. No. 4,963,511 to Smith, teaches a method of forming a tungsten plug whereby a tungsten non-selective layer is formed on a contact hole sidewalls thus inhibiting tungsten from forming on the sidewalls.

U.S. Pat. No. 5,219,789 to Adan discloses a method of forming a contact whereby a SOG layer is used to mask a TiW layer which coats the surface of a contact hole.

U.S. Pat. No. 5,187,120 to Wang discloses a contact formation method whereby a first TiN layer is formed on the bottom of a contact hole in a dielectric layer to promote the nucleation of tungsten. A second layer which resists nucleation of tungsten is formed on the surface of the dielectric layer.

While these methods improve the reliability and manufacturability of tungsten electrical contacts, further improvement is desirable.

SUMMARY OF INVENTION

It is an object of the invention to provide a structure for an improved electrical connection in a multi-layered semiconductor circuit.

Another more specific object of the present invention is to provide an improved structure and method of forming metal silicide nucleation sites for the deposition of tungsten (W) on both the sidewalls and bottom surfaces of a contact hole.

A more specific object of the present invention is to provide an improved structure and method of forming titanium silicide ($TiSi_x$) or titanium nitride (TIN) nucleation sites (layers) for the deposition of tungsten (W) on both the sidewalls and bottom surfaces of a contact hole.

These needs are met by the invention which provides a structure and method of forming an electrical interconnection for a multi-layer semiconductor device wherein a metal silicide layer (e.g., $TiSi_x$) or a metal nitride (e.g., TiN) is formed on the sidewalls and bottom surface of a contact hole. The metal silicide and metal nitride layers act as nucleation layers to promote the proper formation of the tungsten interconnect (i.e., plug). Two embodiments of the present invention include a metal nitride etch to remove the metal nitride from areas outside the contact hole. Two other embodiments use a SOG masking/etch process to remove the nucleation layer form areas outside the contact hole, thereby leaving the nucleation layer on the contact hole surfaces.

The first embodiment of the present invention provides for etching a contact hole through a dielectric layer formed on a semiconductor substrate. The contact hole is defined by substantially vertical sidewalls and a bottom contact surface. Polysilicon spacers are formed on the sidewalls. Subsequently, a metal layer, such as titanium, is blanket deposited. The metal layer is heated in a nitrogen containing atmosphere thereby forming a metal silicide layer and metal nitride layer on the side-walls and bottom surface. Next, the exposed metal nitride layer and unreacted remaining metal layer are removed. A tungsten interconnect is formed in the contact hole using the metal silicide layer as a nucleating layer so that the tungsten properly fills the contact hole and forms electrical contact with the bottom surface.

In a second preferred embodiment of the present invention, the process sequence is the same as the first embodiment except after the metal and metal nitride layers are removed, a second metal nitride layer is formed on the titanium silicide layer on the contact hole surfaces. A tungsten interconnect is formed in the contact hole using the second metal nitride layer as a nucleating layer so that the tungsten properly fills the contact hole and forms electrical contact with the bottom surface.

In a third embodiment, after the metal silicide and metal nitride layers are formed on the substrate surfaces, a spin-on-glass (SOG) layer is formed which partially fills the contact hole. The SOG layer covers (masks) the metal nitride and metal layers on the sidewalls and the bottom surface. The unmasked metal nitride and metal layers are etched off. Then the spin-on-glass layer is removed thereby leaving the metal nitride layer and metal layer on the contact hole surfaces. Next, a tungsten interconnect is formed in the contact hole using the metal nitride layer as a nucleating layer so that the tungsten properly fills the contact hole and forms electrical contact with the bottom surface.

In the fourth preferred embodiment, the process of the third embodiment is followed with an additional step. Following the deposition of the metal, a third metal nitride layer is deposited over the metal layer. This third metal nitride acts as the nucleation layer for the subsequent tungsten interconnect formed in the contact hole.

DETAILED DESCRIPTION OF THE PREFERRED EMBODIMENTS

The present invention will be described in detail with reference to the accompanying drawings. It should be noted that the drawings are in greatly simplified form. In practice the device structure and electrical interconnect (e.g., contact plug) will be one of many supported on a common substrate connected with suitable metallurgy in various known electronic circuit configurations.

Figure 1:
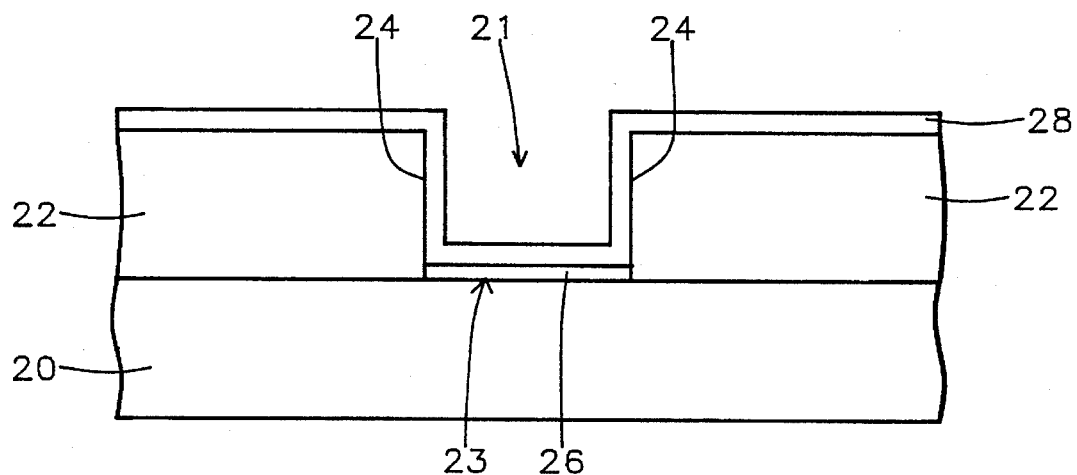
FIGS. 1 through 5 are a sequence of cross-sectional views in broken section in greatly enlarged scale that illustrate a first embodiment of a process for forming an electrical interconnection in accordance with the invention.

FIGS. 1–5, illustrate a first embodiment of a method for forming an electrical interconnection of the present invention. As shown in FIG. 1, shows a contact opening 21 in which an electrical interconnect will be formed according to the invention. The contact opening 21 is formed through a dielectric layer 22 which can be formed on a substrate 20. The substrate can have devices formed within, such as source or drains, and/or have devices formed on the substrate surface, such as gates or lines. For this illustration, dielectric layer 22 is formed on a semiconductor substrate 20 which can be a monocrystalline silicon semiconductor body with many devices (not shown) fabricated therein, as is well known in the art.

Dielectric layer 22 can be formed of silicon oxide and has a thickness in the range of about 3000 to 10,000 Å and more preferably a range of about 3000 to 7000 Å. Layer 22 be formed of any dielectric material, such as silicon oxide.

Contact hole 21 is formed in the dielectric layer using conventional photolithography and etching techniques. Contact hole 21 can have a diameter in the range of about 0.3 to 1.0 micron, and more preferably a diameter of about 0.4 to 0.6 microns. The contact hole 21 is defined by the substantially vertical sidewalls 24 of the dielectric layer 22 and a bottom contact surface 23 of the substrate.

Subsequently, a silicon oxide layer 26 is formed on the bottom surface 23. Silicon oxide layer 26 has a thickness in the range of about 30 to 200 Å and more preferable a thickness in the range of about 50 to 150 Å. Silicon oxide layer 26 can be formed by any conventional thermal process.

A polysilicon layer 28 is deposited on the surface of the silicon oxide layer 26, sidewalls 24 and bottom surface 23. Polysilicon layer 28 can be formed by a conventional low pressure chemical vapor deposition (LPCVD) or sputtering process. Polysilicon layer 28 has a thickness in the range of about 500 to 1000 Å.

Figure 2:
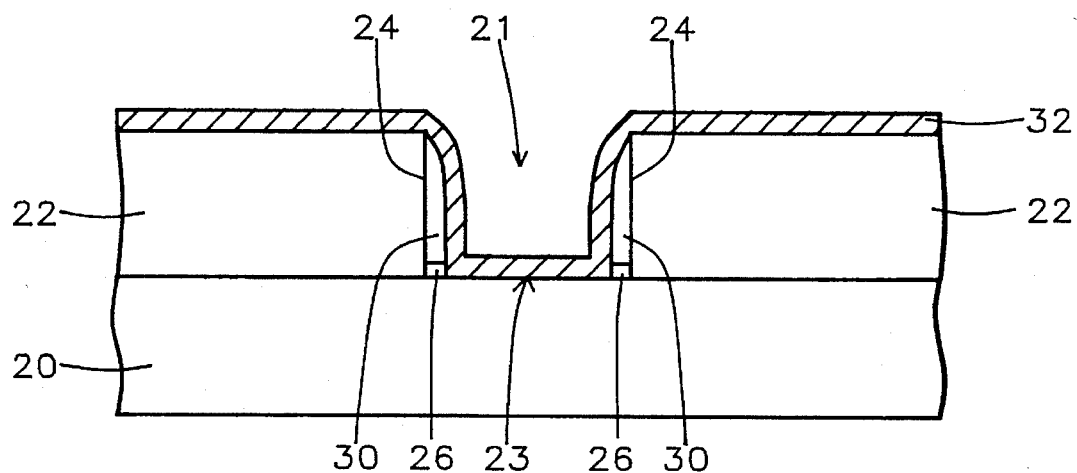

As shown in FIG. 2, the polysilicon layer 28 is then anisotropically etched to form polysilicon side-wall spacers 30 on the sidewalls 24 of the contact hole 21. The silicon oxide layer 26 is used as an etch stop for the polysilicon etch. Following this, portions of the silicon oxide layer 26 that do not underlie the spacers 23 are etched off using a conventional etch, such as a plasma etch.

A metal layer 32 is formed on the polysilicon spacers, the bottom surface, and the dielectric layer 22. Metal layer 32 is preferably formed of titanium (Ti), and can be form by a conventional sputter deposition or chemical vapor deposition. The metal layer 32 has a thickness in the range of about 300 to 800 Å and preferably a thickness in the range of about 300 to 500 Å and most preferably a thickness of approximately of 500 Å.

Figure 3:
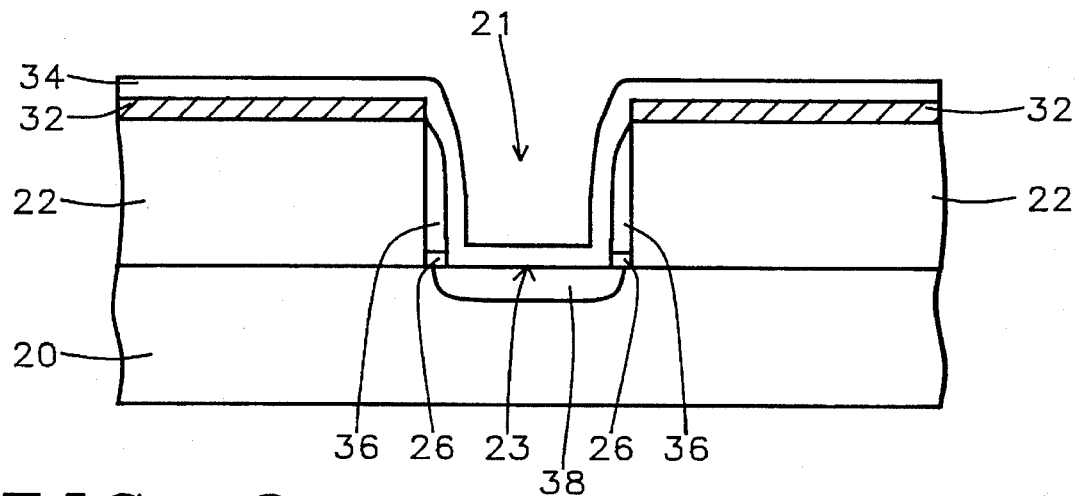

As illustrated in FIG. 3, the substrate is heated forming a metal silicide layer 36, 38 and a metal nitride layer 34 on the spacers 30 and bottom surface 23. The metal silicide layer is preferably titanium silicide ($TiSi_x$) and the metal nitride layer is preferably titanium nitride (TiN) but many other metal silicides and metal nitrides are suitable. The metal silicide layers 36, 38 and metal nitride layers are formed using a rapid thermal annealing process (RTA) at a temperature in the range of about 600° to 750° C. and more preferably a temperature in the range of about 600° to 700° C. for a time interval between about 20 and 60 seconds, and using a nitrogen containing gas, such as nitrogen ($N_2$) or ammonia ($NH_3$) gas.

The metal silicide (e.g., $TiSi_x$) layer can have a thickness in the range of about 500 to 1500 Å. The metal nitride layer can have a thickness in the range of about 150 to 500 Å.

Figure 4:
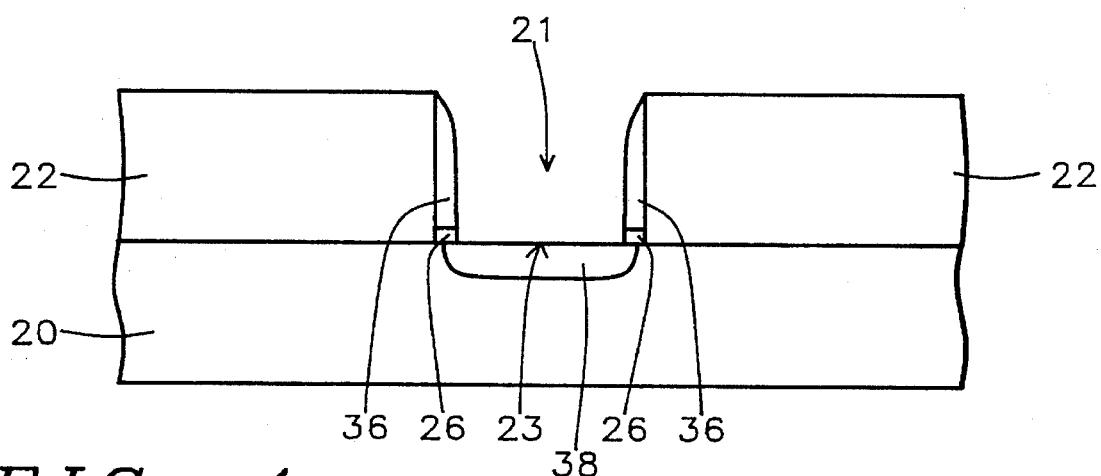

As shown in FIG. 4, the exposed metal nitride layer 34 and the remaining metal layer 32 are removed. This leaves the metal silicide layer 36, 38 on the spacers and bottom contact surfaces. The metal silicide layer acts as a nucleating layer for the subsequent tungsten deposition. Preferably, the metal nitride layer 34 and the metal layer 32 are removed by an etch using hydrogen peroxide ($H_2O_2$) water solution at a temperature of between about 50° to 80° C. for a time sufficient to remove the layers. A solution of $H_2O_2/NH_4/H_2O$ can also be used with this etching purpose with a ratio of about 1:1:5 at a temperature in the range of about 50° to 80° C. for approximately 20 to 60 minutes.

Figure 5:
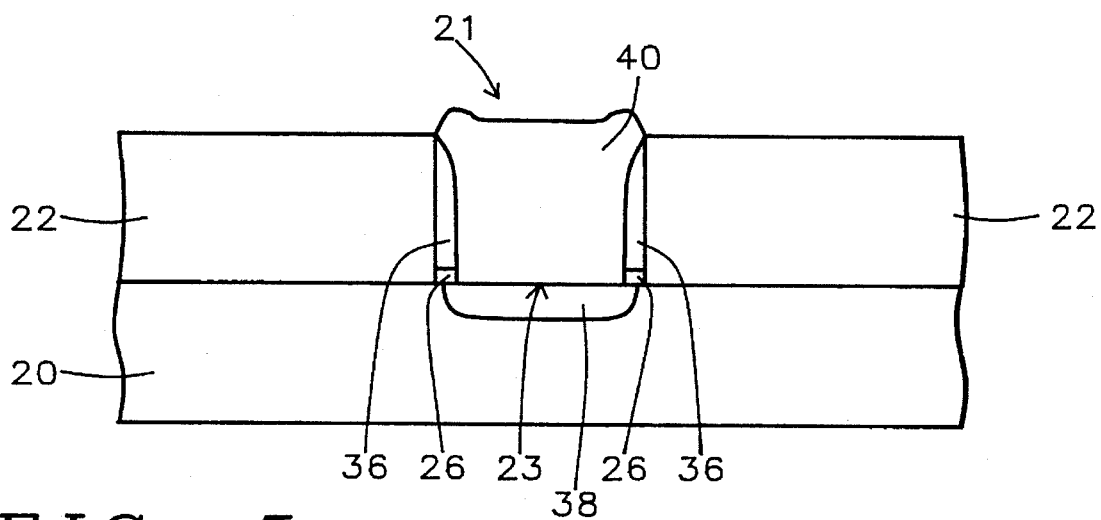

Now as shown in FIG. 5, the contact hole 21 is filled with tungsten layer (plug) 40 so that the tungsten fills the contact hole 21 and forms an electrical contact with the bottom surface 23. The tungsten (W) layer (interconnect or plug) 40 is selectively formed with a chemical vapor deposition (CVD) process where the metal silicide layer 36 provides nucleation for the selective formation of the tungsten plug.

Figure 6:
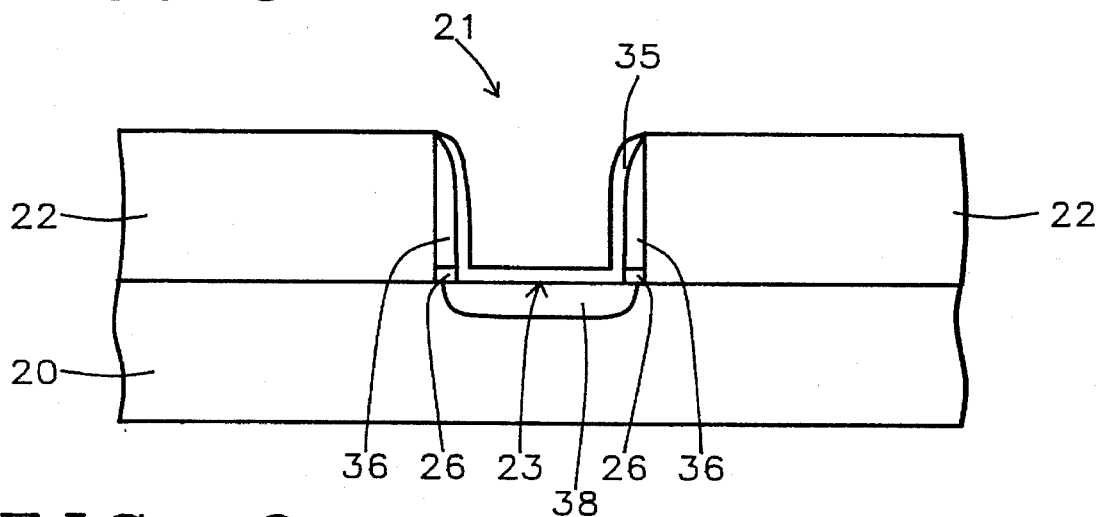
FIGS. 6 and 7, in combination with FIGS. 1–3, are a sequence of cross-sectional views in broken section in greatly enlarged scale that illustrate a second embodiment of a process for forming an electrical interconnection of the present invention.
Figure 7:
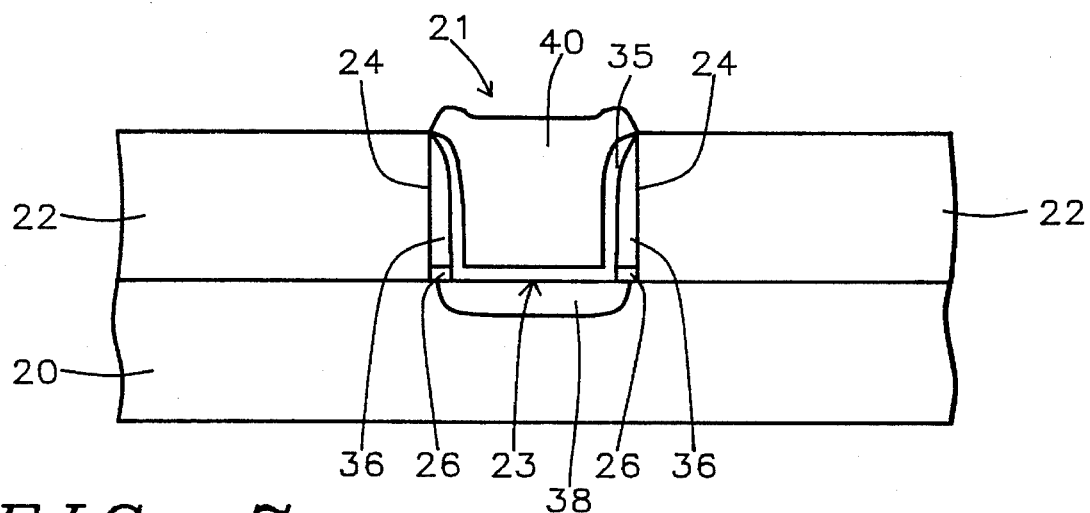

In a second preferred embodiment, shown in FIGS. 1 through 3 combined with FIGS. 6 and 7, a second metal nitride layer 35 is formed on the metal silicide (e.g., $TiSi_x$) layers 36, 38 which promotes the nucleation of tungsten. The process is similar the process explained above in FIGS. 1–3. As shown in FIG. 6, after the metal layer 32 and metal nitride layer 34 are removed, a second metal nitride layer 35 is formed on the titanium silicide layer 36, 38 on the sidewalls and bottom surface. Second metal nitride layer 35 is preferably formed of titanium nitride and can be formed by a rapid thermal anneal (RTA) process (as described above) or a thermal furnace process. The second metal nitride layer forms selectively on the metal silicide surfaces.

Second metal nitride layer 35 has a thickness in the range of about 50 to 300 Å and preferably a thickness in the range of about 50 to 100 Å. The second metal nitride layer acts as a nucleation layer for the selective tungsten chemical vapor deposition which forms the tungsten plug 40 as shown in FIG. 7. In some applications, the second metal nitride layer 35 provides better nucleation than the titanium silicide layer 36, 38.

Figure 8:
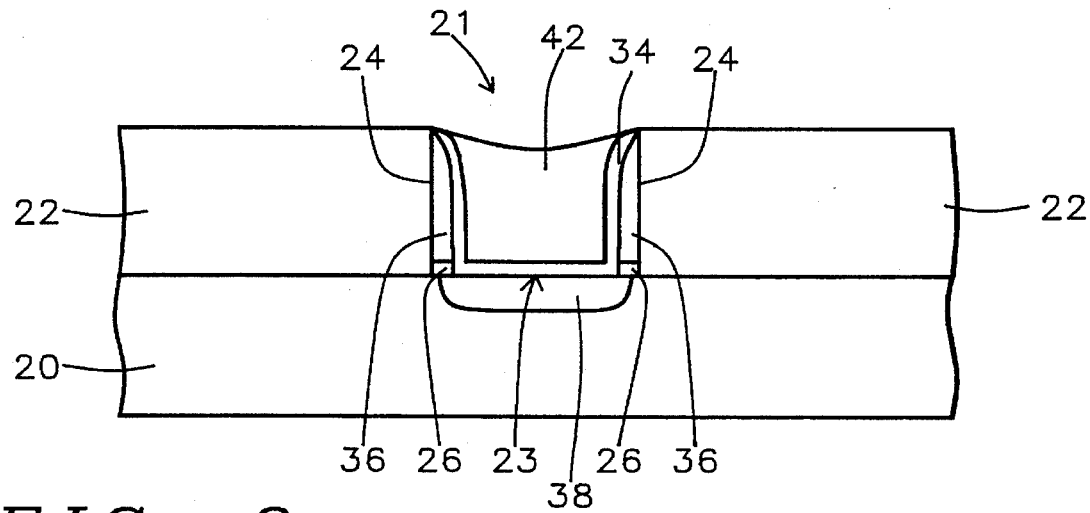
FIGS. 8 and 9, in combination with FIGS. 1–3, are a sequence of cross-sectional views in broken section in greatly enlarged scale that illustrate a third embodiment of a process for forming an electrical interconnection of the present invention.
Figure 9:
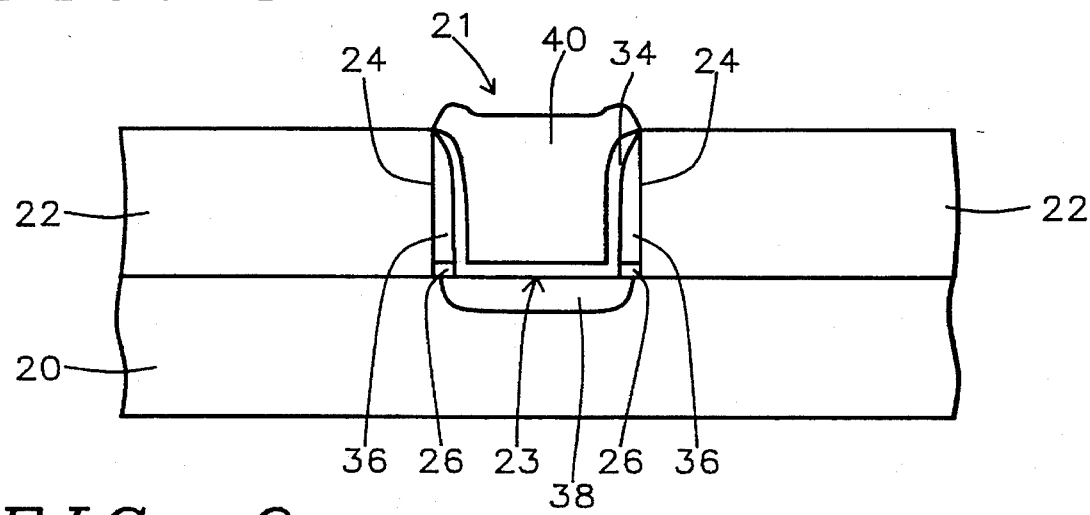

In a third preferred embodiment, shown in FIGS. 1 through 3 combined with FIGS. 8 and 9, a spin on glass layer (SOG) 42 is used as an etch mask to cover the metal nitride layer 34 on the spacers 36 and bottom surface 23. The process is similar to the process explained above in FIGS. 1 through 3. As shown in FIG. 8, after the metal layer 32 and metal nitride layer 34 are formed (FIG. 3), a layer of spin-on-glass (SOG) 42 is formed which at least partially fills the contact hole 21. The SOG layer 42 covers the metal layer 32 and metal nitride 34 layer in the contact hole 21. SOG layer 42 can be formed by a standard spin coating of material, then dry. SOG can either be cured to $SiO_2$ at about 300° C. or not cured. The SOG layer can also be etched back by a reactive ion etching (RIE) or a plasma etch. The SOG layer has a sufficient thickness to find and cover openings and may have, for example, a thickness in the range of about 2000 to 5000 Å.

Next, the portions of the metal layer 32 and metal nitride layer 34 that are not masked by the SOG layer 42 are etched and removed, preferably with hydrogen peroxide ($H_2O_2$). The SOG layer 42 is then removed using a HF etch. Lastly, as shown in FIG. 9, a tungsten (W) layer 40 fills the contact hole 21 forming the interconnect 40 as explained above.

Figure 10:
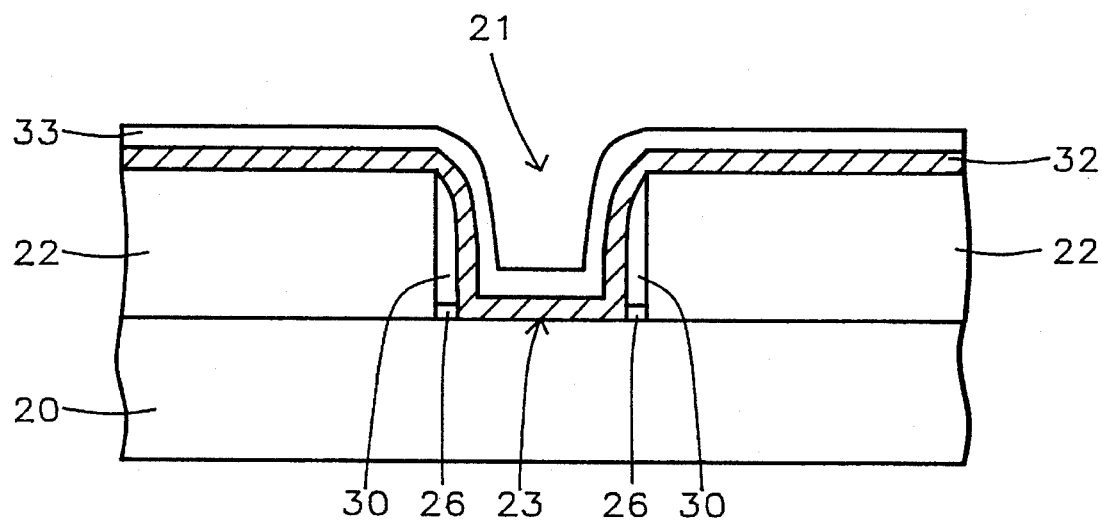
FIGS. 10 through 13, in combination with FIG. 1, are a sequence of cross-sectional views in broken section in greatly enlarged scale that illustrate a fourth embodiment of a process for forming an electrical interconnection of the present invention.
Figure 11:
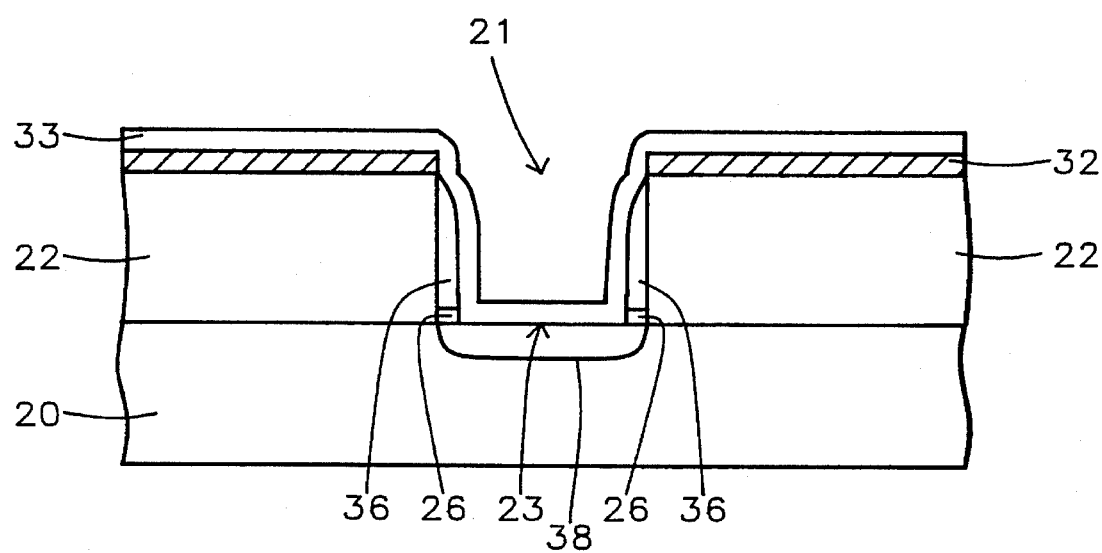

In a fourth preferred embodiment, as shown in FIGS. 1 through 3 combined with FIGS. 10 and 11, after the metal layer 32 is deposited, an additional (third) metal nitride layer 33 is formed. The process then proceeds as in the third embodiment above with the tungsten interconnect deposited into the contact hole 21. The fourth embodiment is describe in more detail below.

The process for the fourth embodiment is similar the process explained above in FIGS. 1 and 2. As shown in FIG. 10, after the metal layer 32 is formed, a third metal nitride layer 33 is deposited on the metal layer 32. The third metal nitride layer 33 is preferably formed of TiN and is preferably sputter deposited using a conventional sputter process. The sputtered metal nitride layer 33 has the advantage in that it can be formed thicker than a RTA formed metal nitride layer 35 (e.g., RTA metal nitride thickness is about 200 Å).

Next, as shown in FIG. 11, a rapid thermal anneal (RTA) process is used to form metal silicide (e.g., $TiSi_x$) layers 36, 38 on the spacers 30 and on the bottom surface 23. The RTA process is the same as describe above.

Figure 12:
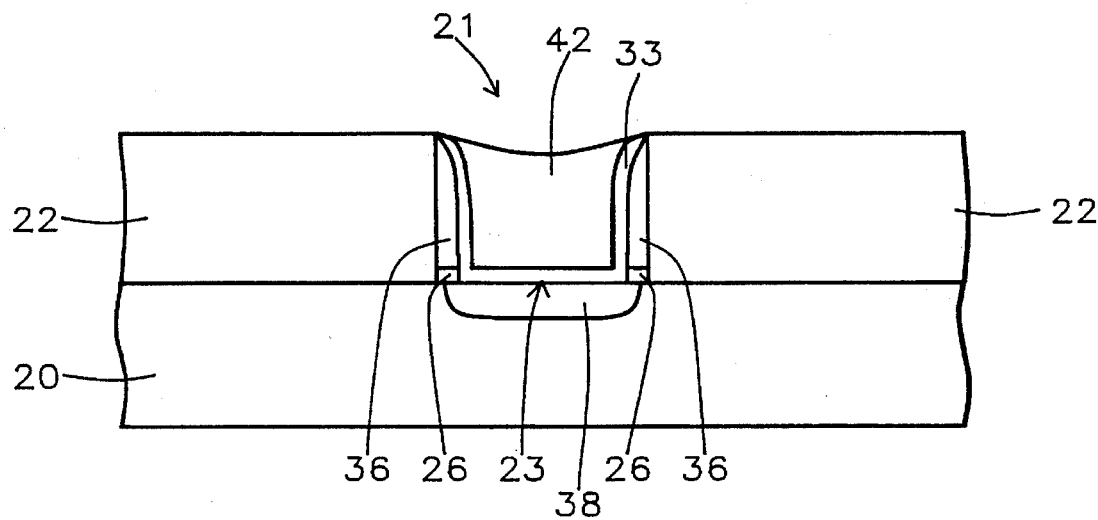
Figure 13:
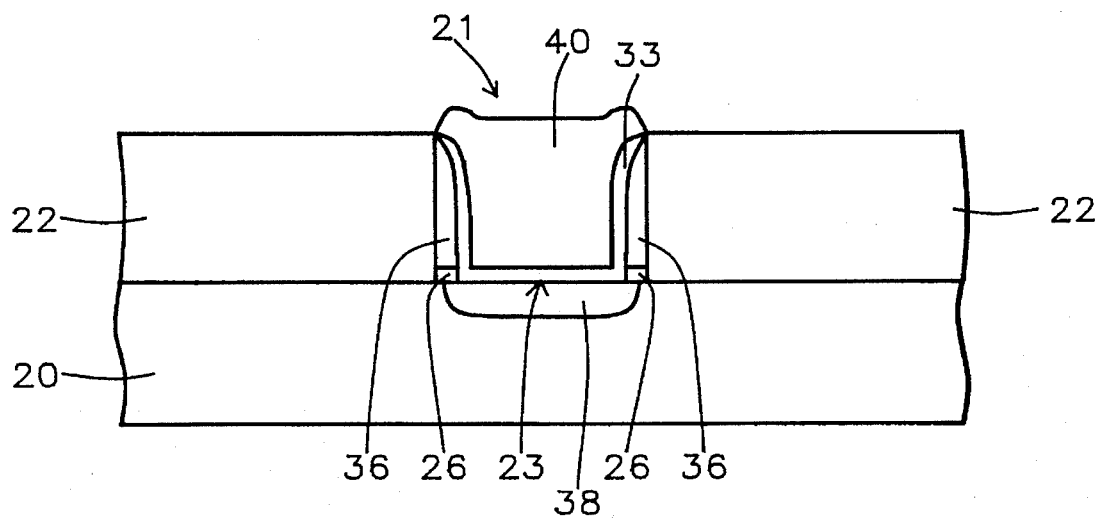

Next, a SOG layer 42 is formed in the contact hole 21 as shown in FIG. 12. The third metal nitride layer 33 and metal layer 32 not covered by the SOG are then removed. Again, the SOG layer 42 is used as an etch mask for the $H_2O_2/H_2O$ etch. The SOG layer is removed leaving the metal silicide layers 36, 38 and metal nitride 33 layers in the contact hole 21. A tungsten plug 40 is formed in contact hole 21 using the selective CVD process described above. The third metal nitride layer 33 is a nucleating layer for the tungsten deposition.

The phrase "electrical contact" is often reserved for an electrical interconnect directly to a device, and the phrase "electrical via" is often reserved for an electrical interconnection between two layers of a device. The invention disclosed here is applicable to formation of both electrical contacts and electrical vias, and the phrase "electrical interconnect" is used to refer to either contacts or vias. For example, the invention can be used to form electrical connections to underlying substrates containing silicon, polysilicon, tungsten silicide and tungsten.

The invention has been described using Ti as a metal layer but other metals can be used. Also, Titanium silicide has been used in the description, but other metal silicides can also be used. Moreover, TiN is described but, other metal nitrides can also be used. Ti, $TiSi_x$ and TiN are preferred compositions of the metal layer, the metal silicide layer, and the metal nitride layer.

The nucleation layers 36, 38, 33, and 34 (metal silicides and metal nitrides) prevent many of the problems described in the prior art. The nucleation layer promotes even tungsten deposition so the contact hole is evenly filled without defects and spaces. This even growth prevents the "nail head" problem associated with overfilling the contact hole. Moreover, the invention eliminates, the problem of prior art process where photoresist processes are used to define the nucleation layers. The photoresist leaves residues on the dielectric layer which promote nucleation tungsten growth outside of the contact hole thereby causing fails. The invention is an uncomplicated process which reduces manufacturing costs.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrical interconnection for a multi-layer semiconductor circuit, the method comprising the steps of:

forming a dielectric layer on a substrate;

etching a contact hole through said dielectric layer, said contact hole defined by substantially vertical sidewalls of said dielectric layer and a bottom contact surface of the substrate;

forming a silicon oxide layer on said bottom contact surface;

depositing a silicon polysilicon layer on the substrate surface;

etching the polysilicon layer to form polysilicon sidewall spacers on said sidewalls and exposing portions of said silicon oxide layer on the bottom contact surface;

removing the exposed portions of said silicon oxide layer on said bottom contact surface;

depositing a metal layer on said spacers, on said bottom contact surface and on said dielectric layer;

forming a metal silicide layer and a first metal nitride layer on at least said spacers and said bottom contact surface by reacting said metal layer with said polysilicon layer and said bottom contact surface;

removing the first metal nitride layer and the remaining unreacted metal layer; and filling only the contact hole with tungsten so that the tungsten forms electrical contact with the bottom surface without forming tungsten on other surfaces, thus forming the electrical interconnection of the invention.

2. The method of claim 1 wherein after said metal layer is formed of titanium, said metal nitride layer formed of titanium nitride, and said metal silicide is titanium silicide.

3. The method of claim 1 wherein the dielectric layer has a thickness in the range of about 3000 to 10,000 Å.

4. The method of claim 1 wherein the contact hole has a diameter in the range of about 0.3 to 1.0 microns.

5. The method of claim 1 wherein the thickness of the silicon oxide is in the range of about 50 to 200 Å.

6. The method of claim 1 wherein the thickness of polysilicon layer is in the range of about 500 to 1500 Å.

7. The method of claim 1 wherein the thickness of metal layer is in the range of about 300 to 800 Å.

8. The method of claim 1 wherein the thickness of said metal silicide layer is in range of about 500 to 1500 Å.

9. The method of claim 1 wherein said metal and metal nitride layers are removed by a wet $H_2O_2$ solution.

10. The method of claim 9 wherein said metal and metal nitride layers are removed by a wet $H_2O_2$ solution composed of $H_2O_2/NH_4OH/H_2O$ at a ratio of 1:1:5 at a temperature between about 50° to 80° C. for between about 20 to 60 minutes.

11. A method of forming an electrical interconnection for a multi-layer semiconductor circuit, the method comprising the steps of:

forming a dielectric layer on a substrate;

etching a contract hole through said dielectric layer, said contact hole defined by substantially vertical sidewalls of said dielectric layer and a bottom contact surface of the substrate;

forming a silicon oxide layer on said bottom contact surface;

forming polysilicon side-wall spacers on said sidewalls of said dielectric layer;

removing said silicon oxide layer on said bottom contact surface;

depositing a metal layer onto said spacers, on said bottom contact surface and on said dielectric layer;

forming a metal silicide layer and a first metal nitride layer on at least said spacers and said bottom contact surface by reacting said metal layer with said polysilicon layer and said bottom contact surface;

removing the first metal nitride layer and the remaining unreacted metal layer;

forming a second metal nitride layer on the metal silicide layer on said sidewalls spacers and said bottom contact surface; and filling only the contact hole with tungsten so that the tungsten forms electrical contact with the bottom surface without forming tungsten on other surfaces, thus forming the electrical interconnection of the invention.

12. The method of claim 11 wherein said metal layer is titanium, said first metal nitride layer is TiN and said metal silicide is titanium silicide.

13. The method of claim 11 wherein said second metal nitride layer is formed by a rapid thermal anneal with $N_2$ or $NH_3$ gas at a temperature in the range of about 700° to 800° C. for less than about 60 seconds.

14. The method of claim 13 wherein said metal layer is titanium, said first metal nitride layer is TiN and said metal silicide is titanium silicide.

15. A method of forming an electrical interconnection for a multi-layer semiconductor circuit, the method comprising the steps of forming a dielectric layer on a substrate;

etching a contact hole through said dielectric layer, said contact hole defined by substantially vertical sidewalls of said dielectric layer and a bottom contact surface of the substrate;

forming a silicon oxide layer on said bottom contact surface;

forming polysilicon side-wall spacers on said sidewalls of said dielectric layer and exposing said silicon oxide layer on the bottom contact surface;

removing said silicon oxide layer on said bottom contact surface;

depositing a metal layer onto said spacers, on said bottom contact surface and on said dielectric layer;

forming a metal silicide layer and a first metal nitride layer on at least said spacers and said bottom contact surface by reacting said metal layer with said polysilicon layer and the substrate on said bottom contact surface;

forming a spin-on-glass layer which partially fills said contact hole, the spin-on-glass layer covering the first metal nitride layer and metal layer on said spacers and said bottom contact surface;

removing portions of the first metal nitride layer and the remaining unreacted metal layer that are not covered by the spin-on-glass layer;

removing the spin-on-glass layer; and filling only the contact hole with tungsten so that the tungsten forms electrical contact with the bottom surface without forming tungsten on other surfaces, thus forming the electrical interconnection of the invention.

16. The method of claim 15 wherein said metal layer is titanium, said first metal nitride layer is TiN and said metal silicide is titanium silicide.

17. A method of forming an electrical interconnection for a multi-layer semiconductor circuit, the method comprising the steps of;

forming a dielectric layer on a substrate;

etching a contact hole through said dielectric layer, said contact hole defined by substantially vertical sidewalls of said dielectric layer and a bottom contact surface of the substrate;

forming a silicon oxide layer on said bottom contact surface;

depositing a silicon polysilicon layer on the surface of said silicon oxide layer;

forming polysilicon side-wall spacers on said sidewalls;

removing said silicon oxide layer;

depositing a metal layer on said spacers, on said bottom contact surface and on said dielectric layer;

depositing a third metal nitride layer over the metal layer;

forming a metal silicide layer on at least said spacers and said bottom contact surface by reacting said metal layer with said polysilicon layer and the substrate on said bottom contact surface;

forming a spin-on-glass layer which partially fills said contact hole; the spin-on-glass layer covering said third metal nitride layer and metal layer on said spacers and said bottom contact surface;

removing the uncovered portions of the third metal nitride layer and the remaining unreacted metal layer;

and removing the spin-on-glass layer; and filling only the contact hole with tungsten so that the tungsten forms electrical contact with the bottom surface without forming tungsten on other surfaces, thus forming the electrical interconnection of the invention.

18. The method of claim 17 wherein said metal layer is titanium, said third metal nitride layer is TiN and said metal silicide is titanium silicide.

* * * * *